(12) United States Patent
Lippert et al.

(10) Patent No.: US 6,800,881 B2
(45) Date of Patent: Oct. 5, 2004

(54) SILICON-GERMANIUM HETERO BIPOLAR TRANSISTOR WITH T-SHAPED IMPLANTATION LAYER BETWEEN EMITTER AND EMITTER CONTACT AREA

(75) Inventors: Gunther Lippert, Frankfurt an der Oder (DE); Hans-Jörg Osten, Muellrose (DE); Bernd Heinemann, Frankfurt an der Oder (DE)

(73) Assignee: IHP GmbH-Innovations for High Performance Microelectronics/Institut fur Innovative Mikroelektronik, Frankfurt (DE)

( * ) Notice: Subject to any disclaimer, the term of this patent is extended or adjusted under 35 U.S.C. 154(b) by 77 days.

(21) Appl. No.: 10/234,440

(22) Filed: Aug. 30, 2002

(65) Prior Publication Data

US 2003/0071281 A1 Apr. 17, 2003

Related U.S. Application Data

(62) Division of application No. 09/319,699, filed as application No. PCT/EP97/02908 on Dec. 8, 1997.

(30) Foreign Application Priority Data

Dec. 9, 1996 (DE) .......................................... 196 52 423
Dec. 6, 1997 (DE) .......................................... 197 55 979

(51) Int. Cl.$^7$ ............................................. H01L 31/072
(52) U.S. Cl. ........................ 257/198; 257/197; 257/591; 257/592; 438/320
(58) Field of Search ................................ 257/197, 198, 257/591, 592

(56) References Cited

U.S. PATENT DOCUMENTS 4,885,614 A    12/1989    Furukawa et al. ............. 357/16
5,177,025 A    1/1993     Turner et al. .................. 437/31
5,189,504 A    2/1993     Nakayama et al. .......... 257/422
5,323,031 A  * 6/1994     Shoji et al. .................. 257/198

(List continued on next page.)

FOREIGN PATENT DOCUMENTS

| EP | 0552561 | 7/1992 | ......... H01L/21/331 |
| EP | 0581369 | 2/1994 | ......... H01L/29/73 |
| EP | 0717435 | 6/1996 | ......... H01L/21/22 |
| JP | 5102177 | 4/1993 | ......... H01L/29/72 |

OTHER PUBLICATIONS

Si Heterojunction Bipolar Transistors, L.D. Lanzerotti; IEDM Technical Digest; International Electronic Devices Meeting; Dec. 11–14, 1994.
Heterojunction Bipolar Transistors; L.D. Lanzerotti; IEEE; 1996.
IEDM Technical Digest; International Electronic Devices Meeting; Dec. 8–11, 1996.

(List continued on next page.)

Primary Examiner—David Nelms
Assistant Examiner—Dao H. Nguyen
(74) Attorney, Agent, or Firm—Ware, Fressola, Van Der Sluys & Adolphson LLP

(57) ABSTRACT

A silicon-germanium hetero bipolar transistor comprising a silicon collector layer, a boron-doped silicon-germanium base layer, a silicon emitter layer and an emitter contact area. The transistor is fabricated using an epitaxy process on a surface of pure silicon. An electrically inert material is incorporated into the epitaxial layers in order to link the defects in the semiconductor structure and to reduce the outdiffusion of the dopant. Thus, a transistor for high-frequency applications can be fabricated in two ways: to increase the dopant dose of the base region or to reduce the thickness of the base layer. In particular, an implantation or doped region having a T-shaped cross section profile is provided between the emitter layer and the emitter contact area.

16 Claims, 2 Drawing Sheets

U.S. PATENT DOCUMENTS

| | | | | |
|---|---|---|---|---|
| 5,323,032 A | | 6/1994 | Sato et al. | 257/198 |
| 5,352,912 A | | 10/1994 | Crabbe et al. | 257/198 |
| 5,360,986 A | | 11/1994 | Candelaria | 257/183 |
| 5,378,901 A | | 1/1995 | Nii | 257/77 |
| 5,387,807 A | | 2/1995 | Bayraktaroglu | 257/197 |
| 5,514,902 A | | 5/1996 | Kawasaki et al. | 257/607 |
| 5,557,118 A | | 9/1996 | Hashimoto | 257/197 |
| 5,739,062 A | * | 4/1998 | Yoshida et al. | 438/320 |
| 5,840,613 A | * | 11/1998 | Sato | 438/320 |
| 6,043,541 A | * | 3/2000 | Violette et al. | 257/370 |
| 2003/0071277 A1 | * | 4/2003 | Lippert et al. | 257/197 |
| 2003/0071278 A1 | * | 4/2003 | Lippert et al. | 257/197 |

OTHER PUBLICATIONS

Physics of Semiconductor Devices, 2nd Edition; John Wiley & Sons, Inc., 1981.

High Speed SiGe–HBT With Very Low Base Sheet Resistivity; E. Kasper; 1993 IEEE.

Optimization of SiGe HBT Technology for High Speed Analog and Mixed–Signal Applications; D.L. Hareme; 1993 IEEE.

2001 IEDM Call for Papers, IEEE International Electron Devices Meeting. (No date provided.).

2001 IEDM; 2001 IEEE International Electron Devices Meeting; Dec. 3–5, 2001.

L. D. Lanzerotti et al. : Si/Si1–x–yGexCy/Si Heterojunction Bipolar Transistors; IEEE Electron Device Letters, vol. 17, No. 7, Jul. 1996, pp. 334–337.

K. Eberl et al. : Growth and straing compensation effects in the ternary $Si_{i-x-y}Ge_xC_y$ alloy system; Appl. Phys. Lett., vol. 60, No. 24, pp. 3033–3035, 1992.

J. L. Regolini et al. : Growth and characterization of strain compensated $Si_{i-x-y}Ge_xC_y$ epitaxial layers; Meter. Lett., vol. 18, pp. 57–60, 1993.

SiGe Base Bipolar Technology with 74 Ghz $f_{max}$ and 11 ps Gate Delay; T. F. Meister, IEDM95–739.

Prinz et al. : The Effects of Base Dopant Outdiffusion and Undoped Si–Ge Junction Spacer Layers in Si/Si–Ge/Si Heterojunction Bipolar Transistors; pp. 42–44; IEEE Electron Device Letters, vol. 12, No. 2, Feb. 1991.

Liefting et al. : Improved Device Performance by Multistep or Carbon Co–Implants; pp. 50–55; IEEE Transactions on Electron Devices, vol. 41, No. 1, Jan. 1994.

Lombardo et al. : Reduction of secondary defect density by C and B implants in GeSi layers formed by high dose Ge implantation in (100) Si ; pp. 2335–2337: Appl. Phys. Lett. 62 (19) , May. 10, 1993.

Harame et al. : Si/SiGe Epitaxial–Base Transistors–Part I : Materials, Physics, and Circuits; pp. 455–468 ISEE Transactions on Electron Devices, vol. 42, No. 3, Mar. 1995.

Shafi et al. : Analysis and modeling of the base currents of Si/Si–Ge heterojunction bipolar transistors fabricated in high and low oxygen content material; pp. 2823–2829; J. Appl. Phys., 78 (4), Aug. 15, 1995.

Herbots et al. : The onset of secondary phase preciptation during synthesis of heteroepitaxial Si–GeC on Si (100) ; pp. 782–784; Appl. Phys. Lett. 68 (6) , Feb. 5, 1996.

D. Lanzerotti et al. : Suppression of Boron Outdiffusion in SiGe HBTs by Carbon Incorporation; pp. 249–252; IEEE IEDM Technical Digest, 1996.

H. J. Osten: Supersaturated carbon in silicon and silicon/germanium alloys; Materials Science and Engineering, B36 (1996), pp. 268–274.

R. Hull : Equilibrium theories of misfit dislocation networks in the SiGe/Si system; vol. 1. 2, pp. 9–20, May. 1999.

* cited by examiner

SILICON-GERMANIUM HETERO BIPOLAR TRANSISTOR WITH T-SHAPED IMPLANTATION LAYER BETWEEN EMITTER AND EMITTER CONTACT AREA

This application is a divisional of copending application(s) application Ser. No. 09/319,699 filed on Jul. 19, 1999 which is a 371 of International Application PCT/EP97/020908 filed on Dec. 8, 1997 and which designated the U.S.

FIELD OF THE INVENTION

The invention relates to a silicon germanium hetero bipolar transistor for high frequency applications and to a method of fabricating the epitaxial individual layers of a silicon germanium hetero bipolar transistor for high frequency applications.

BACKGROUND OF THE INVENTION

Aside from using gallium arsenide for fabricating super high frequency transistors, silicon germanium hetero bipolar transistors, because of their lower fabrication costs, have found increased use in high frequency areas. The sequence of layers in such transistors generally consists of a silicon collector layer, a base layer of p-doped silicon germanium, and an emitter layer.

German laid-open patent specification 43 01 333 A1 describes a method of fabricating integrated silicon germanium hetero bipolar transistors in which a collector layer, a base layer, an emitter layer and an emitter connection layer are precipitated and doped at the same time in a single uninterrupted process. This method of fabricating transistors for high frequency applications suffers from the drawback that a further increase in the doping of the base with doping atoms would lead to an outdiffusion, i.e. a broadening of the base region, at a corresponding temperature. Outdiffusion of dopants, on the one hand, results in a non-uniform fabrication of transistors and, on the other hand, in a reduction of collector and emitter currents. Accordingly, it is not possible by this method to improve the high frequency properties of transistors. Also, broadening of the doped regions limits a further reduction of the structure.

Japanese patent application JP 5,102,177 discloses a silicon-germanium hetero bipolar transistor wherein 5% of the lattice in the base layer has been dislocated by carbon in order to compensate for mechanical strain introduced by the germanium. However, such high carbon concentrations result in a strong local lattice deformation which limits the suitability of such transistors for high frequency applications.

Also, in IEEE Electron Device Letters, Vol. 17, No. 7, July 1996, pp.334–337, as well as Appl. Phys. Lett., vol. 60, No. 24, pp. 3033–3035, 1992 and Meter. Lett., Vol. 18, pp. 57–60, 1993, carbon is incorporated into the base for the purpose of attaining current compensation of germanium in silicon by carbon as well as a variation in the band gap. Optimum results were found at a carbon concentration of $5 \cdot 10^{20}$ cm$^{-3}$. Drawbacks similar to those of the above-mentioned JP 5,102,177 may be expected. In IEEE Electron Device Letters, Vol. 17, No. 7, July 1996, pp. 334–337, large surface MESA transistors with emitter surfaces of 400 $\mu$m$^2$ (line width 20 $\mu$m) were used to define static component properties. Such transistors with large emitter surfaces do not satisfy high frequency applications.

To fabricate SiGe transistors suitable for high frequency applications line widths less than 2 $\mu$m are necessary as disclosed, for instance, in T. F. Meister: SiGe Base Bipolar Technology with 74 Ghz $f_{max}$ and 11 ps Gate Delay; IEDM95-739.

U.S. Pat. No. 5,378,901 discloses a silicon carbide transistor in which silicon carbide is used as the material for the base, collector and emitter. The high fabrication temperatures prevent their integration into circuits suitable for high frequency applications.

SUMMARY OF THE INVENTION

It is a task of the invention to provide a silicon germanium hetero bipolar transistor suitable for high frequency applications in which the outdiffusion of dopant from the base region is reduced by more than 50% compared to conventional silicon germanium hetero bipolar transistors. It is a further task of the invention to structure known methods of fabricating the epitaxial individual layers of such silicon germanium hetero bipolar transistor suitable for high frequency applications with a silicon collector layer, a doped silicon germanium base layer and a silicon emitter layer so as to reduce the usual limitations and complex requirements of subsequent processes. This refers especially to the implantation dose and the temperature time stress of the epitaxial layer. Silicon germanium hetero bipolar transistors made by this method have a higher transitory frequency, an increased maximum oscillation frequency and/or a reduced noise level depending upon requirements and intended application.

Furthermore, it is a task of the invention by a point defect supported diffusion acceleration to prevent boron outdiffusion from the silicon germanium layer, in order to attain HF properties without losses in a scaling range of a line width of 0.4 $\mu$m or less. In this manner, similar transitory and maximum oscillation frequencies are to be attained compared to larger emitter surfaces.

In accordance with the invention these tasks are accomplished by the invention described hereinafter.

A monocrystalline structure according to a desired transistor profile is precipitated on a surface of pure silicon. In at least one of its three individual layers, i.e. its emitter layer or its base layer or its collector layer, the silicon germanium hetero bipolar transistor in accordance with the invention contains an additional material which is electrically inert, preferably an element from group IV, in a concentration between $10^{18}$ cm$^{-3}$ and $10^{21}$ cm$^{-3}$. The semiconductor arrangement of the silicon germanium hetero bipolar transistor is fabricated by an epitaxy process, e.g. by vapor phase epitaxy or molecular-beam epitaxy. The technological process steps following the epitaxy lead to defects, e.g. interstitial atoms in the semiconductor crystal, which enhance the diffusion of atoms foreign to the lattice, such as dopants. An electrically inactive material of the kind referred to and incorporated into the epitaxial layer links these defects and reduces the diffusion of the dopant. The relative alteration of the lattice constant caused by the incorporation of an electrically inert material, preferably carbon, is less than $5$–$10^{-3}$. The outdiffusion of the dopant is reduced which limits broadening of the base region. This allows fabrication of transistors suitable for high frequency applications in two ways: The dopant dose of the base region is increased and/or the width of the base is reduced. Either way leads to an increase in the concentration of dopant in the base region of the transistor by between 5–$10^{18}$ cm$^{-3}$ and $10^{21}$ cm$^{-3}$ if the dopant used is boron. This leads to a reduced resistance of the inner base. The invention proceeds on the basis of the conventional fabrication of a preprocessed silicon substrate. The method is characterized by the following process steps: Initially silicon is deposited by vapor deposition for fabricating the collector layer. Germanium is additionally incorporated during the following further silicon vapor deposition and is doped with lattice doping atoms. The preferred dopant used is boron. The base is fabricated by this process step. After discontinuing the addition of boron and the doping medium the emitter layer is fabricated by further vapor deposition of silicon.

During at least one of the mentioned process steps, an electrically inert material, preferably carbon, is added in a concentration of between $10^{18}$ cm$^{-3}$ and $10^{21}$ cm$^{-3}$, the relative change in the lattice constant thus introduced being less than $5 \cdot 10^{-3}$ owing to the low concentration of the electrically inert material. A low additional lattice distortion does not imply an additional source of possible lattice defects. CVD (chemical vapor deposition) and MBE (molecular-beam epitaxy) processes are used to fabricate the epitaxial layers. Conventional further processing is carried out to complete the terminating steps in fabricating the silicon germanium hetero bipolar transistor in accordance with the invention, the product of the germanium concentration in the base layer and the thickness of the base layer from the collector to the emitter is between 50 atomic percent nm and 2,000 atomic percent nm. The thickness of the base layer from the collector to the emitter is between about 5 nm and 60 nm and, preferably, between 35 nm and 40 nm. The concentration of germanium in the base layer is between about 8% and 30% and, preferably, between 20% and 28%.

The elements of the invention have not only been set forth in the claims but also in the description and in the drawings, whereby individual elements constitute patentable inventions not only by themselves but also when combined as subeombinations, the protection of which is here being applied for. Embodiments of the invention have been depicted in the drawings and will be described in greater detail hereinafter.

BEST MODE TO CARRY OUT THE INVENTION

Figure 1:
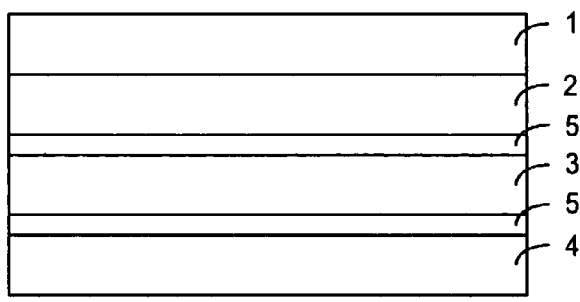
FIG. 1 is a schematic rendition of the layer structure of a silicon germanium hetero bipolar transistor.

In FIG. 1, there is shown the layer structure of a silicon germanium hetero bipolar transistor in accordance with the invention, consisting of a doped silicon substrate 1, a non-doped silicon carbon collector layer 2, a doped silicon germanium carbon layer 3 and a non-doped silicon carbon emitter layer 4. The entire layer structure including doping of the base region with boron is fabricated by molecular beam epitaxy.

In this embodiment, carbon in a concentration between $10^{18}$ cm$^{-3}$ and $10^{21}$ cm$^{-3}$ is added simultaneously with the epitaxy of all three individual layers: the collector layer, the base layer and the emitter layer. This corresponds to a carbon concentration of between 0.0015% and 1.5%. In this manner an otherwise possible outdiffusion of boron is significantly reduced so that the regions of dopant outdiffusion 5 may be reduced compared to conventional transistors of this kind.

By the addition of carbon in accordance with the invention the diffusion length of boron is reduced by more than 50% compared to a diffusion length occurring where no carbon has been added. The result is a very stable boron profile. The thus reduced base width results in a reduced base transit time. This, in the context of the transistor in accordance with the invention, is the same as an increased transit frequency and an increased maximum oscillation frequency or a reduced noise level.

By increasing the boron concentration to between $5$–$10^{18}$ cm$^3$ and $10^{21}$ cm$^{-3}$ in the base layer the suitability of the silicon germanium hetero bipolar transistor may be further improved.

Figure 2:
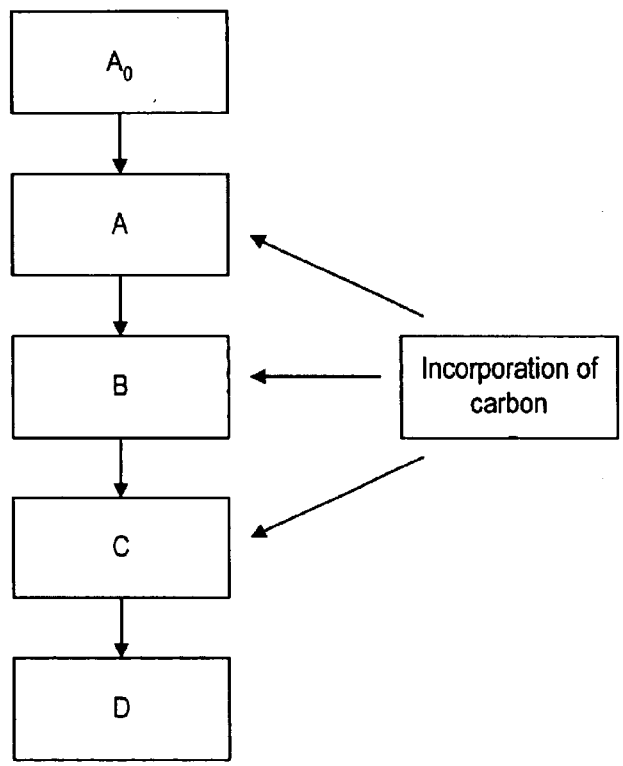
FIG. 2 depicts steps of the method of fabricating the epitaxial individual layers of a silicon germanium hetero bipolar transistor.

For fabricating such a silicon germanium hetero bipolar transistor, the following process steps shown in FIG. 2 are performed: Prior to carrying out the method in accordance with the invention a pretreated silicon substrate is conventionally made in a process step $A_0$. This is followed by the steps of:

A vapor deposition of silicon to fabricate the collector layer;

B vapor deposition of silicon and additional incorporation of germanium and dopant for fabricating the base layer; and C discontinuing germanium and dopant and vapor deposition for fabricating the emitter layer whereby carbon in a concentration of between $10^{18}$ cm$^{-3}$ and $10^{21}$ cm$^{-3}$ is incorporated during at least one of the process steps with the relative change of the lattice constant thus introduced being less than $5 \cdot 10^{-3}$.

The epitaxy is followed by conventional further processing D to complete the terminating steps in a final silicon germanium hetero bipolar transistor in accordance with the invention.

Figure 3:
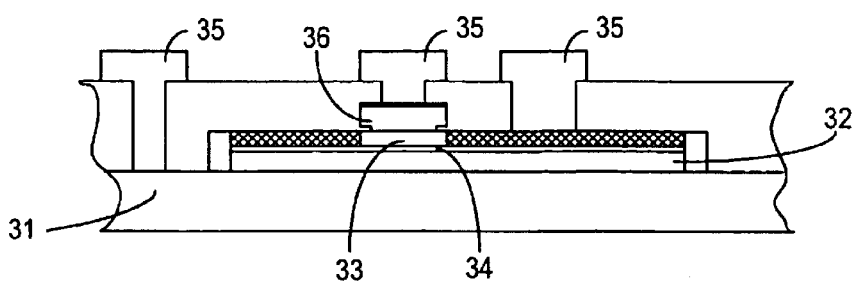
FIG. 3 is a schematic section through a silicon germanium hetero bipolar transistor.

FIG. 3 depicts a schematic section through a silicon germanium hetero bipolar transistor thus fabricated. The non-doped silicon carbon collector 32, the non-doped silicon carbon emitter 33 and the base 34 of silicon, germanium and carbon doped with boron in a concentration between $5$–$10^{18}$ cm$^{-3}$ and $10^{21}$ cm$^{-3}$ have been grown by epitaxy on the highly doped silicon substrate 31. Furthermore, the figure depicts the corresponding contact areas 35 as well as an implantation region 36. The carbon concentration in the epitaxial layer is between $10^{18}$ cm$^{-3}$ and $10^{21}$ cm$^{-3}$.

Figure 4:
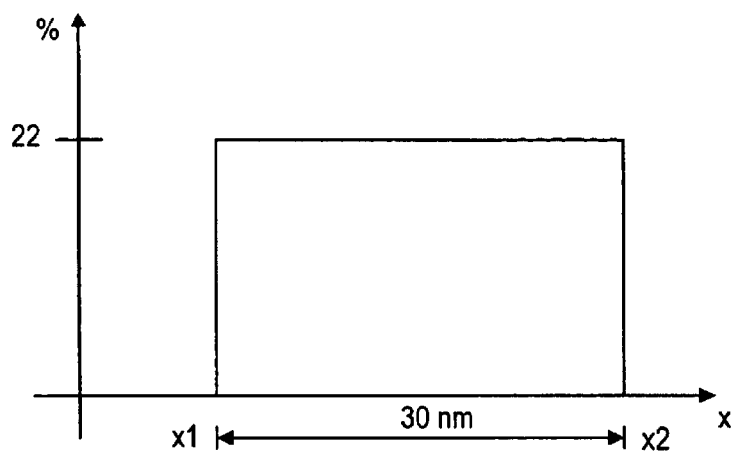
FIGS. 4, 5, 6 depict concentration curves of germanium in silicon germanium hetero bipolar transistors.
Figure 5:
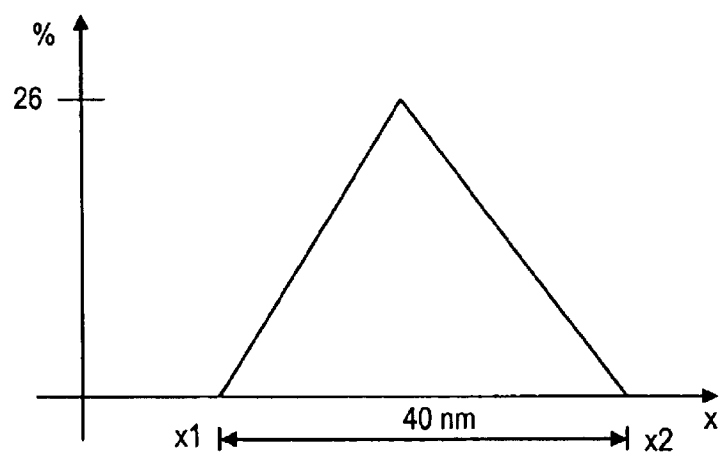
Figure 6:
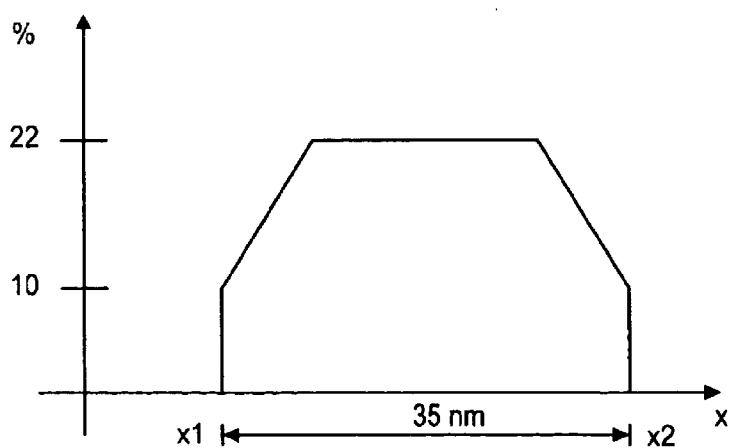

FIGS. 4 to 6 represent concentration curves of germanium in the silicon of silicon germanium hetero bipolar transistors in accordance with the invention. The curves are rectangular, triangular or trapezoidal. In all diagrams, the base region is limited on the abscissa by value x1 and x2. The ordinate represents the curve as a percentage of the germanium concentration.

In the transistor having the rectangular germanium concentration curve of FIG. 4 the width of the base layer is 30 nm. The concentration of germanium in the base layer is about 22% constant. Preferred high current amplifications and good dynamic properties may be obtained with this transistor profile.

In the transistor with the triangular germanium concentration curve of FIG. 5 the width of the base layer is 40 nm. The concentration of germanium in the center of the base layer where it reaches its maximum is about 26%. This transistor profile makes it possible to set very high early currents. Moreover, this transistor profile permits impressing a drift field for reducing the base transit time of the minority carrier.

In the transistor with the trapezoidal germanium concentration curve of FIG. 6 the width of the base layer is 35 nm.

The concentration of germanium in the base layer increases linearly from the side of the collector or emitter of the transistor from about 10% to 22%. In this embodiment, high current amplification as well as high early current and a drift field are attained for reducing the transit time of the base.

At increased scaling broadening of the contact regions is avoided by the prevention of boron outdiffusion by carbon so that HF properties are preserved without losses in the scaling range of a line width of 0.4 μm or less. Compared to larger structures the same transit and maximum frequencies are attained here at lower currents.

In the context of the present invention a silicon germanium hetero bipolar transistor suitable for high frequency applications and a method of fabricating the epitaxial individual layers of such a transistor have been described with reference to concrete embodiments. It is, however, to be noted that the present invention is not restricted to the details of the description of the embodiments as changes and alterations are claimed within the metes and bounds of the patent claims.

What is claimed is:

1. A silicon-germanium hetero bipolar transistor comprising:

a collector layer made substantially of silicon;

an emitter layer made substantially of silicon;

a base layer made substantially of boron-doped silicon-germanium disposed between said emitter layer and said collector layer;

an emitter contact area adjacent to said emitter layer further from said base layer; and a doped region between said emitter layer and said emitter contact area, wherein carbon is incorporated in said collector, base and emitter layers in a concentration of between $10^{18}$ cm$^{-3}$ and $10^{21}$ cm$^{-3}$ and said doped region has a T-shaped cross section profile defined by a top section and a narrower bottom section, and wherein the bottom section is adjacent to said emitter layer.

2. The silicon-germanium hetero bipolar transistor of claim 1, wherein an isolation layer extends on both sides of the bottom section of said T-shaped profile between said emitter layer and the ton section of said doped section.

3. The silicon-germanium hetero bipolar transistor of claim 1, wherein germanium is incorporated in said base layer in a concentration of between 8 atomic % and 30 atomic %.

4. The silicon-germanium hetero bipolar transistor of claim 1, wherein the concentration of germanium in said base layer is in the range of 20 atomic % to 28 atomic %.

5. The silicon-germanium hetero bipolar transistor of claim 1, wherein the concentration profile of germanium in said base layer between said emitter layer and said collector layer has a general shape of a rectangle.

6. The silicon-germanium hetero bipolar transistor of claim 1, wherein the profile of germanium in said base layer between said emitter layer and said collector layer has a general shape of a triangle.

7. The silicon-germanium hetero bipolar transistor of claim 1, wherein the concentration profile of germanium in said base layer between said emitter layer and said collector layer has a general shape of a trapezoid.

8. The silicon-germanium hetero bipolar transistor of claim 1, wherein said base layer has a thickness between 5 nm and 60 nm as measured from said collector layer to said emitter layer.

9. The silicon-germanium hetero bipolar transistor of claim 1, wherein said base layer has a thickness between 35 nm and 40 nm as measured from said collector layer to said emitter layer.

10. The silicon-germanium hetero bipolar transistor of claim 1, wherein said base layer has a thickness as measured from said collector layer to said emitter layer, and wherein the product of the germanium concentration in said base layer and the thickness of said base layer is in the range of 50 atomic %*nm to less than 1500 atomic %*nm.

11. The silicon-germanium hetero bipolar transistor of claim 1, wherein said base layer has a thickness as measured from said collector layer to said emitter layer, and wherein the product of the germanium concentration in said base layer and the thickness of said base layer is in the range of 50 atomic %*nm to 660 atomic %*nm.

12. The silicon-germanium hetero bipolar transistor of claim 1, wherein said base layer has a thickness as measured from said collector layer to said emitter layer, and wherein the product of the germanium concentration in said base layer and the thickness of said base layer is in the range of 520 atomic %*nm to 660 atomic %*nm.

13. The silicon-germanium hetero bipolar transistor of claim 1, wherein said doped silicon-germanium base layer is immediately adjacent to said emitter layer on one side and to said collector layer on the other side.

14. The silicon-germanium hetero bipolar transistor of claim 1, wherein said base layer is doped with boron in a concentration in the range from $5 \cdot 10^{18}$ cm$^{-3}$ to $10^{21}$ cm$^{-3}$.

15. The silicon-germanium hetero bipolar transistor of claim 14, wherein said base layer has a thickness and said base layer is doped with boron in a concentration in the range of $5 \cdot 10^{18}$ cm$^{-3}$ and $10^{21}$ cm$^{-3}$ over the entire thickness of said base layer between said emitter layer and said collector layer.

16. The silicon-germanium hetero bipolar transistor each of said collector layer, emitter layer and base layer is formed as a lattice, and the incorporation of carbon causes a change in the lattice less than $5 \times 10^{-3}$.

* * * * *

UNITED STATES PATENT AND TRADEMARK OFFICE
CERTIFICATE OF CORRECTION

PATENT NO. : 6,800,881 B2
APPLICATION NO. : 10/234440
DATED : October 5, 2004
INVENTOR(S) : Lippert et al.

It is certified that error appears in the above-identified patent and that said Letters Patent is hereby corrected as shown below:

In column 2, line 54, "5-10$^{-3}$" should be --5•10$^{-3}$--.

In column 2, line 61, "5-10$^{18}$" should be --5•10$^{18}$--.

In column 3, line 32, "subeombinations" should be -- subcombinations --.

In column 4, line 10, "5-10$^{18}$" should be --5•10$^{18}$ --.

In column 4, line 39, "5-10$^{18}$" should be --5•10$^{18}$--.

In column 6, line 2, which is claim 6, line 2, "the profile" should be --the concentration profile--.

In column 6, line 44, which is claim 15, line 2, "claim 14" should be --claim 1--.

In column 6, line 49, which is claim 16, line 1, "transistor each" should be --transistor wherein each--.

Signed and Sealed this

Twenty-ninth Day of May, 2007

JON W. DUDAS
*Director of the United States Patent and Trademark Office*